United States Patent
Lloyd et al.

(10) Patent No.: US 10,190,015 B2
(45) Date of Patent: Jan. 29, 2019

(54) PASSIVATION LAYER COMPRISING A PHOTOCROSSLINKED FLUOROPOLYMER

(71) Applicant: THE CHEMOURS COMPANY FC, LLC, Wilmington, DE (US)

(72) Inventors: Ralph Birchard Lloyd, Fayetteville, NC (US); James F Ryley, Glen Mills, PA (US); Robert Clayton Wheland, Wilmington, DE (US); Sung Jin Chung, Seongnam (KR)

(73) Assignee: THE CHEMOURS COMPANY FC, LLC, Wilmington, DE (US)

( * ) Notice: Subject to any disclaimer, the term of this patent is extended or adjusted under 35 U.S.C. 154(b) by 0 days.

(21) Appl. No.: 15/315,697

(22) PCT Filed: May 27, 2015

(86) PCT No.: PCT/US2015/032540
§ 371 (c)(1),
(2) Date: Dec. 1, 2016

(87) PCT Pub. No.: WO2015/187413
PCT Pub. Date: Dec. 10, 2015

(65) Prior Publication Data
US 2017/0114242 A1    Apr. 27, 2017

Related U.S. Application Data

(60) Provisional application No. 62/026,079, filed on Jul. 18, 2014, provisional application No. 62/006,929, filed on Jun. 3, 2014.

(51) Int. Cl.
*C09D 127/12*    (2006.01)
*C09D 127/18*    (2006.01)
(Continued)

(52) U.S. Cl.
CPC ............ *C09D 127/18* (2013.01); *B05D 1/02* (2013.01); *B05D 1/18* (2013.01); *B05D 1/28* (2013.01);
(Continued)

(58) Field of Classification Search
USPC .................. 428/421; 430/270.1, 280.1; 522/4
See application file for complete search history.

(56) References Cited

U.S. PATENT DOCUMENTS 3,132,121 A      5/1964  Pascal
5,958,648 A *    9/1999  Nishimura ............ G03F 7/0046
                                                    430/270.1

(Continued)

FOREIGN PATENT DOCUMENTS

EP      0 880 075 A1      11/1998
JP      63-68604 A         3/1988
(Continued)

OTHER PUBLICATIONS

PCT/US2015/032540 International Report dated Aug. 20, 2015, Authorized Officer Antonio Gallego.

*Primary Examiner* — Tae H Yoon
(74) *Attorney, Agent, or Firm* — Keith W. Palmer

(57) ABSTRACT

The present disclosure relates to a passivation layer comprising a photocrosslinked fluoropolymer and a process for forming the layer. Passivation layers comprising the crosslinked fluoropolymer have low dielectric constants, low water absorptivity and are able to be photoimaged so as to provide the very fine features needed for modern electronic equipment.

30 Claims, 2 Drawing Sheets

(51) Int. Cl.

| | |
|---|---|
| *B32B 27/28* | (2006.01) |
| *G03C 1/74* | (2006.01) |
| *G03F 7/16* | (2006.01) |
| *G03F 7/004* | (2006.01) |
| *G03F 7/039* | (2006.01) |
| *B05D 1/02* | (2006.01) |
| *B05D 1/18* | (2006.01) |
| *B05D 1/28* | (2006.01) |
| *B05D 1/30* | (2006.01) |
| *C08F 114/18* | (2006.01) |
| *C08F 114/26* | (2006.01) |
| *C08F 114/28* | (2006.01) |
| *C08J 3/24* | (2006.01) |
| *C08J 3/28* | (2006.01) |
| *C09D 5/24* | (2006.01) |
| *C09D 127/20* | (2006.01) |
| *C09D 127/22* | (2006.01) |

(52) U.S. Cl.
CPC .......... *B05D 1/305* (2013.01); *C08F 114/185* (2013.01); *C08F 114/26* (2013.01); *C08F 114/28* (2013.01); *C08J 3/24* (2013.01); *C08J 3/28* (2013.01); *C09D 5/24* (2013.01); *C09D 127/12* (2013.01); *C09D 127/20* (2013.01); *C09D 127/22* (2013.01); *G03F 7/0046* (2013.01); *G03F 7/0392* (2013.01); *G03F 7/0397* (2013.01); *C08F 2810/20* (2013.01); *C08J 2327/12* (2013.01); *C08J 2327/18* (2013.01); *C08J 2327/20* (2013.01); *C08J 2327/22* (2013.01)

(56) References Cited

U.S. PATENT DOCUMENTS

| | | | |
|---|---|---|---|
| 7,932,161 B2 * | 4/2011 | Apanius | C08F 32/00 257/781 |
| 2005/0265685 A1 | 12/2005 | Ohashi et al. | |
| 2006/0246371 A1 * | 11/2006 | Nishikawa | G03F 7/0046 430/270.1 |
| 2012/0149798 A1 | 6/2012 | Saito et al. | |
| 2013/0035461 A1 | 2/2013 | Uchida et al. | |

FOREIGN PATENT DOCUMENTS

| | | |
|---|---|---|
| JP | H4-202485 A | 7/1992 |
| JP | 05-302058 A | 11/1993 |
| JP | 09-176245 A | 7/1997 |
| WO | 2006/099380 A2 | 9/2006 |

\* cited by examiner

PASSIVATION LAYER COMPRISING A PHOTOCROSSLINKED FLUOROPOLYMER

This is the U.S. National Stage of Application No. PCT/US2015/032540, filed on May 26, 2015, which claims the benefit of priority to U.S. Provisional Application No. 62/026,079, filed on Jul. 18, 2014 and U.S. Provisional Application No. 62/006,929, filed on Jun. 3, 2014, all of which are hereby incorporated by reference in their entirety.

FIELD OF THE DISCLOSURE

The present disclosure is directed toward passivation layers comprising a photocrosslinkable fluoropolymer, processes for forming the passivation layer and articles comprising the passivation layer. The fluoropolymer is a copolymer produced by the polymerization of a fluoroolefin, an alkyl vinyl ether and a vinyl epoxide.

BACKGROUND OF DISCLOSURE

Polymers are used in electronic devices to provide insulation as well as for protecting the device from physical damage and from moisture. The value of these polymers can be greatly increased if the polymers are photoimageable, i.e., photocrosslinkable in patterns with defined dimensions, so as to provide a three dimensional framework for the interconnection of multiple electronic components and layers.

As electronic devices become smaller, move to higher frequencies and have lower power consumptions, the typically used polyimides have not been able to meet the demands for lower dielectric constants, lower loss tangents and lower moisture absorption. Current polymers used for passivation have dielectric constants in the range of from 3.0 to 3.3 and water absorptivities ranging from 0.8 to 1.7 percent.

There is a continuing need for polymer insulators that have lower dielectric constants and lower water absorptivities that are able to be photoimaged in order to produce electronic components and layers.

SUMMARY OF THE DISCLOSURE

The disclosure relates to a passivation layer comprising a layer of a photocrosslinked coating composition disposed on at least a portion of a substrate, wherein the coating composition comprises;
  i) a photocrosslinkable fluoropolymer having repeat units comprising:
    (a) a fluoroolefin;
    (b) an alkyl vinyl ether wherein the alkyl group is a C1 to C6 straight or a C3 to C6 branched or cyclic, saturated hydrocarbon radical; and
    (c) a vinyl epoxide;
  ii) a photoacid generator;
  iii) an optional photosensitizer; and
  iv) a carrier medium;
wherein the photocrosslinkable fluoropolymer has a number average molecular weight in the range of from 20,000 to 300,000, and, wherein the layer of photocrosslinked coating composition has a dielectric constant in the range of from 1 to 5 when measured at 100 kHz, and wherein a layer of the photocrosslinked coating composition having a thickness in the range of from 0.01 micrometers to 300 micrometers has photocrosslinked features having a minimum width that is the larger of a) about 10 percent of the thickness of the applied layer of photocrosslinked coating composition or b) 0.5 micrometers.

The disclosure also relates to articles comprising the passivation layer.

The disclosure also relates to a process comprising;
  (1) providing the above photocrosslinkable coating composition;
  (2) applying a layer of the photocrosslinkable coating composition onto at least a portion of a substrate;
  (3) removing at least a portion of the carrier medium;
  (4) irradiating at least a portion of the layer of photocrosslinkable coating composition with ultraviolet light;
  (5) heating the applied layer of photocrosslinkable coating composition; and
  (6) removing at least a portion of the uncrosslinked photocrosslinkable fluoropolymer
wherein the photocrosslinkable fluoropolymer has a number average molecular weight in the range of from 20,000 to 300,000, and, wherein the layer of photocrosslinked coating composition has a dielectric constant in the range of from 1 to 5 when measured at 100 kHz, and wherein a layer of the photocrosslinked coating composition having a thickness in the range of from 0.01 micrometers to 300 micrometers has photocrosslinked features having a minimum width that is the larger of a) about 10 percent of the thickness of the applied layer of photocrosslinked coating composition or b) 0.5 micrometers.

BRIEF DESCRIPTION OF THE DRAWINGS

The drawings described herein are for illustration purposes only. The drawing are not necessarily to scale, with emphasis being placed upon illustrating the principles of the following disclosure. The drawings are not intended to limit the scope of the present disclosure in any way.

DETAILED DESCRIPTION

Figure 1A:
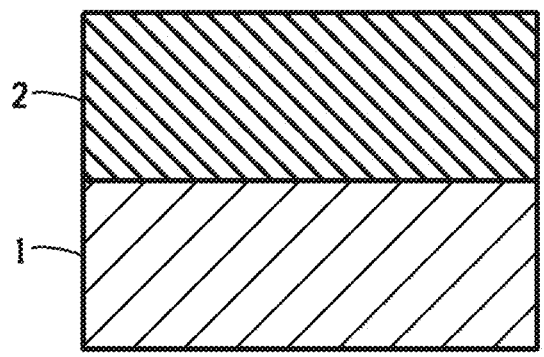
FIG. 1 shows a drawing of a substrate containing a layer of the coating composition.

The features and advantages of the present disclosure will be more readily understood, by those of ordinary skill in the art from reading the following detailed description. It is to be appreciated that certain features of the disclosure, which are, for clarity, described above and below in the context of separate embodiments, may also be provided in combination in a single element. Conversely, various features of the disclosure that are, for brevity, described in the context of a single embodiment, may also be provided separately or in any sub-combination. In addition, references to the singular may also include the plural (for example, "a" and "an" may refer to one or more) unless the context specifically states otherwise.

The use of numerical values in the various ranges specified in this application, unless expressly indicated otherwise, are stated as approximations as though the minimum and maximum values within the stated ranges were both proceeded by the word "about". In this manner, slight variations above and below the stated ranges can be used to achieve substantially the same results as values within the ranges. Also, the disclosure of these ranges is intended as a continuous range including each and every value between the minimum and maximum values.

As used herein:

The term "photocrosslinked" means a crosslinked fluoropolymer wherein the crosslinks within the polymer network are formed as a result of the action of light. For example, compositions comprising the photocrosslinkable fluoropolymer also contain one or more of a photoacid generator and an optional photosensitizer. Irradiating the composition with light of the appropriate wavelength generates acid functional molecules that react with the epoxide groups on the fluoropolymer resulting in the crosslinking of the fluoropolymer.

The phrase "photocrosslinkable fluoropolymer" means an uncrosslinked fluoropolymer that is capable of being photocrosslinked when irradiated with the appropriate wavelength of light in the presence of one or more of a photoacid generator and, optionally, a photosensitizer.

The phrase "photocrosslinked features" refers to the size of the structures that can be produced according to the process of the present disclosure. The photocrosslinked features are defined by the width of the feature formed and optionally by the thickness of the layer of the photocrosslinked coating composition. For example, the disclosed process can form 4 micrometer lines in a coating that is 2 micrometers thick. It should be noted that the photocrosslinked feature refers to the 'hole' that is formed when the uncrosslinked fluoropolymer is removed. For example, where a series of lines are formed, the photocrosslinked feature refers to the width of the gap produced when the uncrosslinked fluoropolymer material is removed. The photocrosslinked features can be formed by irradiating at least a portion of a layer of the coating composition, heating the applied layer of coating composition, then removing the uncrosslinked portions of the coating composition, for example, by dissolving in a solvent.

The phrase "passivation layer" means a layer that provides the underlying substrate protection from environmental damage, for example, water, oxidation and chemical degradation, and has both barrier properties and forms a dielectric layer on the substrate that can be used to separate two conductor layers or two semiconductor layers or a conductive layer from a semiconductor layer. The passivation layer can also be used as a bank layer in a light emitting diode structure that separates the various wells of light emitting diode material from contacting one another.

The phrase "unreactive solvent" means one or more solvents for the photocrosslinkable fluoropolymer or for the coating composition comprising the photocrosslinkable fluoropolymer wherein the unreactive solvent does not become a part of the final crosslinked network as a result of the photocrosslinking with the photocrosslinkable fluoropolymer.

The present disclosure relates to a passivation layer comprising a photocrosslinkable coating composition wherein the photocrosslinkable coating composition comprises a photocrosslinkable fluoropolymer. The passivation layer can be used as a barrier layer and/or an insulating layer in a thin film transistor, organic field effect transistor, semiconductor, semiconductor oxide field effect transistor, integrated circuit, light emitting diode (LED), bank layers for LEDs, including organic LEDs, display device, flexible circuit, solder mask, photovoltaic device, printed circuit board, an interlayer dielectric, optical waveguide, a micro electromechanical system (MEMS), a layer of an electronic display device or a layer of a microfluidic device or chip. The passivation layer can also form a layer that is in the form of a patterned surface for electrowetting applications. The crosslinked coating composition can provide very small photocrosslinked features and provides both low dielectric constants and low water absorptivity.

The passivation layer comprises a layer of photocrosslinked coating composition disposed on at least a portion of a substrate, wherein the coating composition comprises i) a photocrosslinkable fluoropolymer, ii) a photoacid generator, iii) an optional photosensitizer, and iv) a carrier medium, wherein the photocrosslinkable fluoropolymer has a number average molecular weight in the range of from 20,000 to 300,000, and, wherein the layer of photocrosslinked coating composition has a dielectric constant in the range of from 1 to 5 when measured at 100 kHz, and wherein a layer of the photocrosslinked coating composition having a thickness in the range of from 0.01 micrometers to 300 micrometers has photocrosslinked features having a minimum width that is the larger of a) about 10 percent of the thickness of the applied layer of photocrosslinked coating composition or b) 0.5 micrometers. In other embodiments, the width of the photocrosslinked feature is in the range of from 0.5 micrometers to 5 micrometers. In some embodiments, the layer of the photocrosslinked coating composition has a dielectric constant, measured at 100 kHz, that is in a range defined by a minimum and a maximum value wherein the minimum value is 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9 or 3.0, and wherein the maximum value is 5.0, 4.9, 4.8, 4.7, 4.6, 4.5, 4.4, 4.3, 4.2, 4.1, 4.0, 3.9, 3.8, 3.7, 3.6, 3.5, 3.4, 3.3, 3.2 or 3.1.

Another important property for the passivation layer in an electronic device is to have a low amount of water absorptivity. The layer of the disclosed photocrosslinked coating composition has very low water absorptivity when submerged in deionized water for 24 hours at a temperature in the range of from 20 to 22° C. Typical water absorption values can be in the range of from 0.01 to 1.0 percent by weight. In other embodiments, the water absorptivity can be in the range of from 0.03 to 1.0 percent by weight, and in still further embodiments, can be in the range of from 0.05 to 0.9 percent by weight. In still further embodiments, the water absorptivity can be in a range of from 0.05 to 0.8 percent by weight.

The photocrosslinkable fluoropolymer is present in the range of from 80 to 99.5 percent, based on the total weight of the photocrosslinked coating composition. The photocrosslinkable fluoropolymer is a copolymer that is produced by the polymerization of a monomer mixture wherein the monomer mixture comprises: (a) a fluoroolefin, (b) alkyl vinyl ether, and (c) a vinyl epoxide, wherein the total amount of monomers (a), (b), and (c) represents 100 mole percent of the monomer mixture. In some embodiments, the crosslinkable fluoropolymer consists essentially of the monomers (a), (b) and (c) listed above, and, in still further embodiments, the crosslinkable fluoropolymer consists of the monomers listed above as (a), (b) and (c). In those embodiments where the crosslinkable fluoropolymer consists essentially of (a) a fluoroolefin, (b) an alkyl vinyl ether, and (c) a vinyl epoxide, the photocrosslinkable fluoropolymer is free from or substantially free from monomers having cyclic ether groups having more than 3 atoms in the ring, for example, oxetane or furan rings, monomers that have more than one ethylenically unsaturated double bond, or additional ethylenically unsaturated double bonds introduced by a post-polymerization procedure. By "substantially free from" means that the photocrosslinkable fluoropolymer contains less than 5 mole percent of the monomers listed. In other embodiments, the crosslinkable fluoropolymer contains less than 2 mole percent and, in other embodiments, contains less than 1 mole percent of those monomers listed.

Suitable fluoroolefins can include, for example, tetrafluoroethylene, chlorotrifluoroethylene, hexafluoropropylene, trifluoroethylene, perfluoroalkyl vinyl ethers, vinyl fluoride, vinylidene fluoride, perfluorodimethyldioxole, trifluoropropylene, perfluoro(2-methylene-4-methyl-1,3-dioxolane, hexafluoroisobutylene, methyl 3-[1-[difluoro[(trifluorovinyl)oxy]methyl]-1,2,2,2-tetrafluoroethoxy]-2,2,3,3-tetrafluoropropionate, 2-[1-[difluoro[(1,2,2-trifluoroethenyl)oxy]methyl]-1,2,2,2-tetrafluoroethoxy]-1,1,2,2-tetrafluoroethanesulfonyl fluoride, or a combination thereof. In some embodiments, the fluoroolefin monomers can consist of, or consist essentially of tetrafluoroethylene, chlorotrifluoroethylene, hexafluoropropylene, trifluoroethylene, perfluoromethyl vinyl ether, vinyl fluoride, vinylidene fluoride, perfluorodimethyloxole, trifluoropropylene, perfluoro(2-methylene-4-methyl-1,3-dioxolane, hexafluoroisobutylene, methyl 3-[1-[difluoro[(trifluorovinyl)oxy]methyl]-1,2,2,2-tetrafluoroethoxy]-2,2,3,3-tetrafluoropropionate, 2-[1-[difluoro[(1,2,2-trifluoroethenyl)oxy]methyl]-1,2,2,2-tetrafluoroethoxy]-1,1,2,2-tetrafluoro-ethanesulfonyl fluoride or a combination thereof. The perfluoroalkyl vinyl ethers can have a structure according to the formula (I);

$F_2C=CFOR_f$      (I)

wherein $R_f$ is perfluoroalkyl group having in the range of from 1 to 6 carbon atoms. In some embodiments, the perfluoroalkyl vinyl ether is perfluoromethyl vinyl ether. The fluoroolefin is used in the crosslinkable fluoropolymer in the range of from 35 to 55 mole percent, based on the total amount of monomers used to form the photocrosslinkable fluoropolymer. In other embodiments, the fluoroolefin is used in the crosslinkable fluoropolymer in the range of from 40 to 53 mole percent, and, in still further embodiments, is used in the range of from 45 to 50 mole percent.

The crosslinkable fluoropolymer also comprises an alkyl vinyl ether. Suitable alkyl vinyl ethers can include, for example, alkyl vinyl ethers wherein the alkyl group is a C1 to C6 straight or a C3 to C6 branched or cyclicsaturated hydrocarbon radical. In some embodiments, the alkyl vinyl ether is methyl vinyl ether, ethyl vinyl ether, n-propyl vinyl ether, isopropyl vinyl ether, n-butyl vinyl ether, sec-butyl vinyl ether, t-butyl vinyl ether, n-pentyl vinyl ether, isoamyl vinyl ether, hexyl vinyl ether, cyclohexyl vinyl ether or a combination thereof. In other embodiments, the alkyl vinyl ether consists of or consists essentially of methyl vinyl ether, ethyl vinyl ether, n-propyl vinyl ether, isopropyl vinyl ether or a combination thereof. The alkyl vinyl ethers are used in the crosslinkable fluoropolymer in the range of from 40 to 64 mole percent, based on the total amount of the monomers used to form the photocrosslinkable fluoropolymer. In some embodiments, the alkyl vinyl ether is used in an amount in the range of from 42 to 58 mole percent, and, in still further embodiments, is used in the range of from 44 to 54 mole percent.

The crosslinkable fluoropolymer also comprises a vinyl epoxide. Suitable vinyl epoxide monomers can include, for example, allyl glycidyl ether, glycidyl acrylate and glycidyl methacrylate. In some embodiments, the vinyl epoxide consists of, or consists essentially of allyl glycidyl ether. The vinyl epoxides are used in the crosslinkable fluoropolymer in the range of from 1 to 10 mole percent, based on the total amount of monomers used to form the photocrosslinkable fluoropolymer. In other embodiments, the vinyl epoxides are used in the crosslinkable fluoropolymer in the range of from 1.2 to 8 mole percent, and, in still further embodiments, in the range of from 1.4 to 7 mole percent.

In some embodiments, the crosslinkable fluoropolymer consists of or consists essentially of tetrafluoroethylene, ethyl vinyl ether and allyl glycidyl ether. In other embodiments, the crosslinkable fluoropolymer consists of or consists essentially of chlorotrifluoroethylene, ethyl vinyl ether and allyl glycidyl ether. In other embodiments, the crosslinkable fluoropolymer consists of or consists essentially of hexafluoropropylene, ethyl vinyl ether and allyl glycidyl ether. In other embodiments, the crosslinkable fluoropolymer consists of or consists essentially of perfluoromethyl vinyl ether, ethyl vinyl ether and allyl glycidyl ether.

The photocrosslinkable fluoropolymer can be produced according to known methods and can have a number average molecular weight ($MW_n$) in the range of from 20,000 to 300,000 daltons. In other embodiments, the number average molecular weight can be in a range comprising a minimum number average molecular weight to a maximum number average molecular weight wherein the minimum is 25,000, 30,000, 40,000, 50,000, 60,000 or 70,000 and the maximum is 290,000, 280,000, 270,000, 260,000 or 250,000 daltons.

In some embodiments, the monomers (a), (b) and (c) can be polymerized without the use of a solvent, and, in other embodiments, the monomers can be polymerized in a solvent, which may or may not be a solvent for the photocrosslinkable fluoropolymer. In still further embodiments, the photocrosslinkable fluoropolymer can be produced by the emulsion polymerization of the monomers. To produce the desired crosslinkable fluoropolymer, the monomers, at least one free radical initiator and, optionally, an acid acceptor can be charged to an autoclave and heated to a temperature in the range of from 25° C. to about 200° C. for 10 minutes to 24 hours at a pressure in the range of from atmospheric pressure to as high as 1500 atmospheres. The resulting product can then be removed from the autoclave and dried to give the crosslinkable fluoropolymer.

Suitable free radical initiators can be any of the known azo and/or peroxide initiators. For example, di(4-t-butylcyclohexyl)dicarbonate, di-t-butyl peroxide, acetyl peroxide, lauroyl peroxide, benzoyl peroxide, 2,2-azodiisobutyronitrile, 2,2-azobis(2,4-dimethyl-4-methoxyvaleronitrile), dimethyl-2,2-azobis(isobutyrate) or a combination thereof can be used. The amount of free radical initiators that can be used can be in the range of from 0.05 percent by weight to about 4 percent by weight, based on the total amount of the monomers in the monomer mixture. In other embodiments, the amount of free radical initiators used is in the range of from 0.1 percent by weight to about 3.5 percent by weight, and, in still further embodiments, is in the range of from 0.2 percent by weight to 3.25 percent by weight. All percentages by weight are based on the total amount of the monomers in the monomer mixture.

An acid acceptor can also be used when forming the photocrosslinkable fluoropolymer. The acid acceptor can be a metal carbonate or metal oxide, for example, sodium carbonate, calcium carbonate, potassium carbonate, magnesium carbonate, barium oxide, calcium oxide, magnesium oxide or a combination thereof. The acid acceptor can be present in the range of from 0 percent by weight to about 5 percent by weight. In other embodiments, the acid acceptor can be present in the range of from 0.1 percent by weight to 4 percent by weight, and, in still further embodiments, can be present in the range of from 0.2 percent by weight to 3 percent by weight. All percentages by weight are based on the total amount of the monomers in the monomer mixture. The acid acceptor is present in order to neutralize acids, such as hydrogen fluoride that may be present in the fluoroolefin or may be generated during the course of the polymerization.

The present disclosure also relates to a coating composition comprising the i) photocrosslinkable fluoropolymer, ii) a photoacid generator, iii) an optional photosensitizer; and iv) a carrier medium. The photocrosslinkable coating composition can also optionally comprise v) an additive.

Suitable ii) photoacid generators are known in the art and can include, for example, (p-isopropylphenyl)(p-methylphenyl)iodonium tetrakis(pentafluorophenyl)-borate, IRGACURE® GSID-26-1 which is a salt of tris[4-(4-acetylphenyl)sulfanylphenyl] sulfonium and tris(trifluoromethanesulfonyl)methide and is available from BASF, Florham Park, N.J., bis(1,1-dimethylethylphenyl)iodonium salt with tris[(trifluoromethane)sulfonyl]methane also available from BASF, bis(4-decylphenyl)iodonium hexafluoroantimonate oxirane, mono[(C12-C14-alkoxy) methyl] derivatives, available from Momentive as UV9387C, 4,4',4"-tris(t-butylphenyl)sulfonium triflate, 4,4'-di-t-butylphenyl iodonium triflate, diphenyliodonium tetrakis(pentafluorophenyl)sulfonium borate, triarylsulfonium-tetrakis(pentafluorophenyl) borate, triphenylsulfonium tetrakis (pentafluorophenyl) sulfonium borate, 4,4'-di-t-butylphenyl iodonium tetrakis(pentafluorophenyl) borate, tris(t-butylphenyl) sulfonium tetrakis(pentafluorophenyl) borate, 4-methylphenyl-4-(1-methylethyl)phenyl iodonium tetrakis (pentafluorophenyl) borate or a combination thereof. IRGACURE® GSID-26-1 photoacid generator is especially useful as it does not require the separate addition of a photosensitizer. The photoacid generator can be present in the photocrosslinkable coating composition in an amount in the range of from about 0.1 to 10 percent by weight, based on the total amount of the photocrosslinked coating composition. In other embodiments, the photo acid generator can be present in the range of from 0.1 to 7.5 percent by weight, and, in still further embodiments, can be present in an amount in the range of from 0.1 to 5.0 percent by weight. In still further embodiments, the photoacid generator can be present in the range of from 0.3 to 1.0 percent by weight, based on the total amount of the photocrosslinked coating composition.

The composition can also comprise iii) an optional photosensitizer. Suitable photosensitizers can include, for example, chrysenes, benzpyrenes, fluoranthrenes, pyrenes, anthracenes, phenanthrenes, xanthones, indanthrenes, thioxanthen-9-ones or a combination thereof. In some embodiments, the photosensitizer can be 2-isopropyl-9H-thioxanthen-9-one, 4-isopropyl-9H-thioxanthen-9-one, 1-chloro-4-propoxythioxanthone, 2-isopropylthioxanthone, phenothiazine or a combination thereof. The optional photosensitizer can be used in the range of from 0 to about 10 percent by weight, the percentage by weight based on the total amount of the photocrosslinked coating composition. In other embodiments, the photosensitizer can be present in the composition in the range of from 0.2 to 7 percent by weight, and, in still further embodiments, in the range of from 0.5 to 5 percent by weight. All percentages by weight are based on the total weight of the photocrosslinked coating composition.

The composition is typically applied to at least a portion of a substrate as a solution or dispersion of the photocrosslinkable coating composition in iv) a carrier medium. This allows a layer of the photocrosslinkable coating composition to be applied and results in a smooth defect-free layer of photocrosslinked fluoropolymer on the substrate. Suitable carrier medium can include, for example, ketones, ethers, ether esters and halocarbons. In some embodiments, the carrier medium can be a ketone solvent, for example, acetone, acetylacetone, methyl ethyl ketone, methyl isobutyl ketone, methyl amyl ketone, 2-pentanone, 3-pentanone, 2-heptanone, 3-heptanone, cyclopentanone, cyclohexanone; esters, for example, ethyl acetate, propyl acetate, butyl acetate, isobutyl acetate, pentyl acetate, cyclohexyl acetate, heptyl acetate, ethyl propionate, propyl propionate, butyl propionate, isobutyl propionate, propylene glycol monomethyl ether acetate, propylene glycol monoethyl ether acetate, methyl lactate, ethyl lactate, gamma-butyrolactone; ether solvents, for example, diisopropyl ether, dibutyl ether, ethyl propyl ether, anisole; halocarbons, for example, dichloromethane, chloroform, tetrachloroethylene, or a combination thereof. In some embodiments, the carrier medium is methyl isobutyl ketone, 2-heptanone, propylene glycol methyl ether acetate or a combination thereof. In some embodiments, the solvent is an unreactive solvent, meaning that the carrier medium does not become a part of the crosslinked coating after the curing step.

The photocrosslinkable coating composition can also comprise v) one or more optional additives. Suitable additives can include, for example, viscosity modulators, fillers, dispersants, binding agents, surfactants, antifoaming agents, wetting agents, pH modifiers, biocides, bacteriostats or a combination thereof. Such additives are well known in the art and will not be discussed in depth. Typically, the additives comprise less than about 10 percent by weight of the crosslinked coating composition.

The present disclosure also relates to a process using the previously mentioned photocrosslinkable coating composition, wherein the process comprises:
(1) providing a photocrosslinkable coating composition comprising:
   i) a photocrosslinkable fluoropolymer comprising:
      (a) a fluoroolefin;
      (b) an alkyl vinyl ether wherein the alkyl groups is a C1 to C6 straight or a C1 to C6 branched or cyclic saturated hydrocarbon radical; and
      (c) a vinyl epoxide;
   ii) a photoacid generator;
   iii) an optional photosensitizer; and
   iv) a carrier medium;
(2) applying a layer of the photocrosslinkable coating composition onto at least a portion of a substrate;
(3) removing at least a portion of the carrier medium;
(4) irradiating at least a portion of the layer of the photocrosslinkable coating composition with ultraviolet light;
(5) heating the applied layer of photocrosslinkable coating composition to crosslink at least a portion of the photocrosslinkable fluoropolymer; and
(6) removing at least a portion of the uncrosslinked photocrosslinkable fluoropolymer;
wherein the photocrosslinkable fluoropolymer has a number average molecular weight in the range of from 20,000 to 300,000, and wherein the layer of photocrosslinked coating composition has a dielectric constant in the range of from 1 to 5 when measured at 100 kHz, and wherein a layer of the photocrosslinked coating composition having a thickness in the range of from 0.01 micrometer to 300 micrometers has photocrosslinked features having a minimum width that is the larger of a) about 10 percent the thickness of the coating composition or b) 0.5 micrometers. In other embodiments, the minimum width of the photocrosslinked feature is in the range of from 0.5 micrometers to 5 micrometers.

The minimum width of the photocrosslinked feature is related to one or both of a) the thickness of the applied layer of coating composition and/or b) the wavelength of light used to irradiate the photocrosslinkable coating composition. The thicker the applied layer, the more difficult it is to form very thin features, that is, features having a width that is less than 10 percent of the thickness. On the other hand, when the applied layer is relatively thin, for example, less than 5 micrometers, the wavelength of light used to photocrosslink the photocrosslinkable coating composition makes it difficult to form photocrosslinked features having a width of less than 0.5 micrometers. For light having a wavelength in the range of from 150 to 500 nanometers, the photocrosslinked features are limited to greater than or equal to 0.5 micrometers. For example, if a layer of the coating composition is applied to the substrate at a thickness of 10 micrometers, then the minimum width of the photocrosslinked feature will be about 1 micrometer. The word "about" means that the minimum width of the feature can vary by 10 percent. Therefore, in the above example, the minimum width of the photocrosslinked feature can be in the range of from 0.9 to 1.1 micrometers.

The thickness of the applied layer of photocrosslinkable coating composition is in the range of from 0.01 micrometer to 300 micrometers. In some embodiments, the thickness of the applied layer of photocrosslinked coating composition is in the range of from 0.1 to 200 micrometers. In other embodiments, the layer of the photocrosslinked coating composition can have a thickness in the range of from 0.1 micrometers to 50 micrometers.

In other embodiments, the process further comprises the step of applying an adhesion promoter to at least a portion of the substrate prior to the step (2), applying a layer of the photocrosslinkable coating composition onto at least a portion of the substrate. Suitable adhesion promoters can include, for example, organic silane compounds. For example, 3-aminopropyltrimethoxysilane, 3-aminopropyltriethoxysilane, (3-glycidoxypropyl)methyldimethoxysilane, bis [(3-trimethoxysilyl)propyl] ethylenediamine, 1H, 1H, 2H, 2H-perfluorodecyltriethoxylsilane, vinyl trimethoxy silane, vinyl triethoxy silane, glycidoxypropyltriethoxysilane, glycidoxypropyltrimethoxysilane, methacryloxypropyltrimethoxysilane, methacryloxypropyltriethoxysilane, urea propyltriethoxy silane, urea propyltrimethoxy silane or a combination thereof. If an adhesion promoter is used, a layer of the adhesion promoter can be applied to the substrate prior to the application of a layer of the photocrosslinkable coating composition.

The layer of the photocrosslinkable coating composition can be applied to a variety of substrates, including electrically conductive materials, semiconductive materials and/or nonconductive materials. For example, the substrate can be glass, polymeric, inorganic semiconductor, organic semiconductor, tin oxide, zinc oxide, titanium dioxide, silicon dioxide, indium oxide, indium zinc oxide, zinc tin oxide, indium gallium oxide, indium gallium zinc oxide, indium tin zinc oxide, cadmium sulfide, cadmium selenide, silicon nitride, copper, aluminum or a combination thereof. The layer of the photocrosslinkable coating composition can be applied by spin coating, spray coating, flow coating, curtain coating, roller coating, brushing, inkjet printing, screen printing, offset printing, gravure printing, flexographic printing, lithographic printing, dip coating, blade coating or drop coating methods. Spin coating involves applying an excess amount of the photocrosslinkable coating composition to the substrate, then rotating the substrate at high speeds to spread the composition by centrifugal force. The thickness of the resultant film can be dependent on the spin coating rate, the concentration of the photocrosslinkable coating composition, as well as the solvent used. Ambient conditions such as temperature, pressure, and humidity can also effect the thickness of the applied layer of photocrosslinkable coating composition.

After application to the substrate, at least a portion of the carrier medium can be removed by exposing the applied layer of coating composition to elevated temperatures, exposure to less than atmospheric pressure, by directly or indirectly blowing gas onto the applied layer or by using a combination of these methods. For example, the applied layer of coating composition may be heated in air or in a vacuum oven optionally with a small purge of nitrogen gas. In other embodiments, the applied layer of coating composition can be heated to a temperature in the range of from 60 to 110° C. in order to remove the carrier medium.

At least a portion of the applied layer of photocrosslinkable coating composition can then be irradiated (i.e., crosslinked) by exposure to light. The light is typically ultraviolet (UV) light at a wavelength in the range of 150 nanometers (nm) to about 500 nanometers. In some embodiments, the ultraviolet light can be at a wavelength in the range of from 200 to 450 nanometers, and, in other embodiments, in the range of from 325 to 425 nm. In still further embodiments, the exposure can be carried out by exposure to multiple wavelengths, or by irradiation at selected wavelengths, for example, 404.7 nanometers, 435.8 nanometers or 365.4 nanometers. Many suitable UV lamps are known in the industry and can be used. It should be noted that photocrosslinking was not observed after exposing the photocrosslinkable fluoropolymer to a 350 watt high-pressure short-arc mercury lamp, then subjecting to a post-irradiation bake when both the photoacid generator and the photosensitizer were not present.

The photocrosslinkable coating composition can be photocrosslinked using UV-A light. Crosslinking can be achieved when the total exposure to the light source is in the range of from 10 millijoules/centimeter$^2$ (millijoules/cm$^2$) to 500 millijoules/cm$^2$. In other embodiments, the ultraviolet light exposure can be in the range of from 10 to 250 millijoules/cm$^2$, and, in still further embodiments, can be in the range of from 10 to 100 millijoules/cm$^2$. Exposure can be carried out in air or a nitrogen atmosphere.

In order to form the desired crosslinked features, at least a portion of the applied layer of crosslinkable coating composition can be irradiated to begin the crosslinking process only to those portions that were irradiated. The applied layer of photocrosslinkable coating composition can be masked or the step of irradiation can be performed using a focused light source so that the light contacts only those portions that are to be crosslinked. These techniques are well-known in the art. For example, a mask can be applied directly to the applied layer of photocrosslinkable coating composition. This method is known as contact printing. In another embodiment, called proximity printing, the mask is held about 20 to 50 micrometers above the applied layer of photocrosslinkable coating composition without actually contacting the layer. In a third embodiment, an optical exposure device that precisely projects and focuses the light so that an actual physical mask is not needed. In some embodiments, the mask can be a chrome or other metal mask.

Figure 1B:
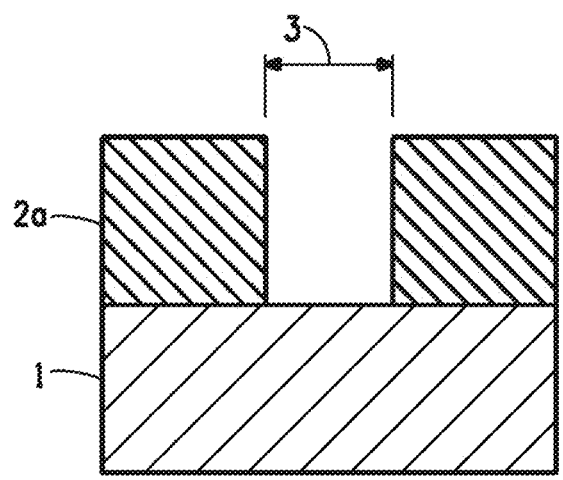

FIG. 1 shows an example of the photocrosslinked feature. In FIG. 1A, a substrate 1 is shown with a layer of the photocrosslinkable coating composition 2 applied thereon. FIG. 1B depicts the substrate 1 and the photocrosslinked coating composition 2a after irradiating a portion of the photocrosslinkable coating composition and removing the uncrosslinked portion of the coating composition. The distance as measured by the width 3 is the width of the photocrosslinked feature.

After exposure to UV light, the applied layer of photocrosslinkable coating composition can be heated. The heating step can be done at a temperature in the range of from 80 to 200° C. In other embodiments, the heating can be done at a temperature in the range of from 100 to 175° C., and, in still further embodiments, in a temperature in the range of from 130° C. to about 150° C. The photocrosslinkable coating composition can be exposed to the elevated temperature for about 30 seconds to about 30 minutes. In other embodiments, the time can be in the range of from 45 seconds to about 15 minutes, and, in still further embodiments, in the range of from 1 minute to 7 minutes.

Once the photocrosslinkable coating composition has been heated, uncrosslinked photocrosslinkable coating composition can be removed by dissolving the photocrosslinkable coating composition using a carrier medium that dissolves the photocrosslinkable fluoropolymer. Occasionally, a small amount of uncrosslinked photocrosslinkable coating composition can remain after the removal step. Remaining polymer can be removed using plasma or a second wash step. The carrier medium can be a mixture of a solvent and a nonsolvent for the photocrosslinkable fluoropolymer. In some embodiments, the ratio of solvent to nonsolvent can be in the range of from 1:0 to 3:1. In other embodiments, the ratio of solvent to nonsolvent can be in the range of from 1:0.1 to 3:1. The solvents can be any of those that are listed under the carrier medium that have the ability to solvate the photocrosslinkable fluoropolymer. In some embodiments, the solvent can be methyl isobutyl ketone, 2-heptanone, propylene glycol monomethyl ether acetate or a combination thereof. In other embodiments, the nonsolvent can be hexane and/or isopropanol.

The passivation layer of the present disclosure can also be used as a bank layer in a light emitting diode. In this particular application, the passivation layer can be used to separate one diode from another, for example, in the production of a display device using organic light emitting diodes, the bank layer can act as a barrier layer separating the red, blue and green light emitting diodes. It can be especially useful as a bank layer for organic light emitting diodes.

The present disclosure also relates to articles comprising a layer of the photocrosslinked coating composition.

EXAMPLES

Unless otherwise noted, all ingredients are available from the Sigma-Aldrich Company, Saint Louis. Mo.

V-601 initiator, dimethyl 2,2'-azobisisobutyrate, is available from Wako Chemicals, Richmond, Va.

TEFLON® polytetrafluoroethylene and KAPTON® polyimide sheets are available from E.I. Du Pont de Nemours and Company, Wilmington, Del.

MELINEX® ST504 heat stabilized polyester film is available from DuPont Teijin Films, Chester, Va.

OAI model 200 mask aligner is available from OAI, San Jose, Calif.

BLAK-RAY® Long Wave UV lamp Model B100AP is available from UVP, LLC, Upland, Calif.

IRGACURE® GSID-26-1 photoacid generator is available from BASF Corporation, Florham Park, N.J.

SILFORCE® UV9387C photoinitiator is available from Momentive, Columbus, Ohio.

Model LC6B Benchtop Conveyor and F300 UV Lamp are both available from Heraeus Noblelight Fusion UV, Gaithersburg, Md.

DRIERITE® desiccant is available from W.A. Hammond Drierite Co. Ltd., Xenia, Ohio.

Autovial™ filters are available from GE Life Sciences, Pittsburgh, Pa.

Preparation of Fluoropolymer #1

A 400 milliliter (ml) autoclave was chilled to less than −20° C. and was loaded with 1 gram (g) of powdered potassium carbonate, 0.24 g V-601 initiator and 2 g of allyl glycidyl ether dissolved in 36 g ethyl vinyl ether. The autoclave was evacuated and further loaded with 50 g tetrafluoroethylene. The reaction mixture was shaken and heated to 66° C. During the reaction, pressure in the autoclave peaked at 333 pounds per square inch (psi), dropping to 139 psi about 12 hours later. The reaction produced 69 grams of a gummy mass. A 62 g portion of the product was purged with nitrogen for about 3 days and then further dried for 19 hours in a 74° C. vacuum oven affording 57 g of a gum elastomer. $C^{13}$ NMR showed 47.3 mole percent tetrafluoroethylene, 50.5 mole percent ethyl vinyl ether and 2.2 mole percent allyl glycidyl ether. Size Exclusion Chromatography (SEC) in tetrahydrofuran (THF) showed a number average molecular weight of 262,000 and a weight average molecular weight of 578,000. Differential Scanning calorimetry (DSC) showed a Tg of −4° C.

Preparation of Photocrosslinked Fluoropolymer #1

A 4 g sample of fluoropolymer #1 was dissolved in 16 g of methyl isobutyl ketone and the 0.2 g of a photoacid generator, (p-isopropylphenyl)(p-methylphenyl)iodonium tetrakis(pentafluorophenyl) borate, and 0.05 g of a photosensitizer, 2-isopropylthioxanthone, was added. The mixing vessel was wrapped in aluminum foil to limit the exposure to light and was rolled until both the photoacid generator and the photosensitizer dissolved. The solution was spincoated onto MELINEX® ST504 polyester film to produce a thin film which was prebaked for 60 seconds at 65° C. to remove at least a portion of the residual solvent. A chrome photomask was lightly pressed onto the top of the film and the assembly was placed in a nitrogen purge box and exposed for 25 seconds to a 350 watt high-pressure short-arc lamp with an output of 12 milliwatts/square centimeter, using a model 200 mask aligner and a UV exposure tool that emits UVA radiation at around 360-400 nanometers. The exposed film was then post baked for 3 minutes at 130° C. to allow the photogenerated acid to crosslink the polymer through the epoxide groups, producing photocrosslinked fluoropolymer #1. The film was then cooled to room temperature and then the crosslinked film/polyester laminate was submerged in methyl isobutyl ketone for 65 seconds to remove the uncrosslinked material. The process yields a crosslinked fluoropolymer pattern having 3 micrometer line spacings.

Preparation of Fluoropolymer #2

This example shows that the fluoropolymer can be produced via a solution polymerization method.

A 400 ml autoclave was chilled to less than −20° C. and was charged with 1 g potassium carbonate, 0.24 g V-601 initiator, 100 ml ethyl acetate, and 2 g allyl glycidyl ether dissolved in 36 g of ethyl vinyl ether. That autoclave was evacuated and further loaded with 50 g tetrafluoroethylene. The reaction mixture was shaken and heated to 66° C. During the reaction, the pressure in the autoclave peaked at 276 psi, dropping to 56 psi about 8 hours later. The reaction gave a viscous solution that was transferred to a TEFLON® sheet in a tray. Blowing down with nitrogen for about 21 hours at 75° C. gave 65 g of an off-white polymer. SEC in THF showed a number average molecular weight of 150,000 and a weight average molecular weight of 316,000.

Preparation of Fluoropolymer #3

A 400 ml autoclave was chilled to less than −20° C. and was charged with 12 g of allyl glycidyl ether, 36 g ethyl vinyl ether, 1 g potassium carbonate and 0.24 g V-601 initiator. The autoclave was evacuated and further loaded with 59 g of chlorotrifluoroethylene. The reaction mixture was shaken and heated to 66° C. The pressure in the autoclave peaked at 127 psi, dropping to 64 psi about 16 hours later. The reaction gave a yellow fluid that was stripped to a viscous fluid on a rotary evaporator. Adding the viscous fluid to a chilled mixture of 1200 ml water and 300 ml of methyl alcohol with vigorous stirring gave stretchy white solids that were transferred to a TEFLON® sheet in a tray. Blowing down with nitrogen and then putting the tray in a vacuum oven at 80° C. for 3 hours gave 69 g of a tough clear polymer. $C^{13}$ NMR showed 49 mole percent chlorotrifluoroethylene, 44.4 mole percent of ethyl vinyl ether and 6.7 mole percent of allyl glycidyl ether. SEC showed a number average molecular weight of 26,000 and a weight average molecular weight of 66,000. DSC showed a Tg of 8° C.

Preparation of Photocrosslinked Fluoropolymer #3

A 0.1 g sample of fluoropolymer #3 was mixed with 0.006 g of a photoacid generator, (p-isopropylphenyl)(p-methylphenyl)iodonium tetrakis(pentafluorophenyl) borate, 0.002 g of a photosensitizer, 2-isopropylthioxanthone, and 5 ml of methyl isobutyl ketone. The mixture was rolled until a solution formed and the solution was spotted onto two glass slides and dried. The first slide was heated for 5 minutes at 140° C. under nitrogen, cooled to room temperature after which time, the film easily dissolved in methyl isobutyl ketone, indicating that no crosslinking occurred. The second slide was irradiated for 1 minute with a BLAK-RAY® Long Wave Ultraviolet lamp, Model B100 AP and then heated to 140° C. for 5 minutes under nitrogen to give photocrosslinked fluoropolymer #3. After cooling to room temperature, the film no longer dissolved in methyl isobutyl ketone, indicating a crosslinked film.

Preparation of Fluoropolymer #4

A 400 ml autoclave was chilled to less than −20° C. and was loaded with 2 g of allyl glycidyl ether, 36 g ethyl vinyl ether, 1 g potassium carbonate and 0.24 g V-601 initiator. The autoclave was evacuated and was loaded with 75 g hexafluoropropylene. The reaction mixture was shaken and heated to 66° C. Pressure in the autoclave peaked at 186 psi, dropping to 110 psi about 15 hours later. The reaction mixture was washed out of the autoclave using acetone and affording a two phase mixture that was mixed at high speed using a Waring blender while 200 ml of methanol was added. The liquid phase was decanted off and an additional 200 ml of methanol was added. The liquid phase was again decanted off and an additional 200 ml methanol was added, with vigorous blending. The solid product was transferred to a TEFLON® lined tray, purged for several days with nitrogen and finally heated for 3 hours in a 90° C. vacuum oven. This gave 76 g of a stretchy solid. C13 NMR showed 49.3 mole percent of hexafluoropropylene, 49.2 mole percent of ethyl vinyl ether and 1.6 mole percent of allyl glycidyl ether. SEC in THF showed a number average molecular weight of 99,000 and a weight average molecular weight of 179,000. DSC showed a Tg of 18° C.

Preparation of Photocrosslinked Fluoropolymer #4 and #4a

A 0.1 g sample of fluoropolymer #4 was mixed with 0.004 g of a photoacid generator, (p-isopropylphenyl)(p-methylphenyl)iodonium tetrakis(pentafluorophenyl) borate, 0.002 g of a photosensitizer, 2-isopropylthioxanthone, and 5 ml of methyl isobutyl ketone. The mixture was rolled until a solution formed and the solution was dotted onto two glass slides and dried. The first slide was heated for 5 minutes at 140° C., cooled to room temperature after which time, the film easily dissolved in methyl isobutyl ketone, indicating that no crosslinking had occurred. The second slide was irradiated for 1 minute with a BLAK-RAY® Long Wave Ultraviolet lamp, Model B100 AP and then heated to 140° C. for 5 minutes under nitrogen to give photocrosslinked fluoropolymer #4. After cooling to room temperature, the film no longer dissolved in methyl isobutyl ketone, indicating that the film had crosslinked.

A 0.1 g sample of fluoropolymer #4 was mixed with 0.002 g of IRGACURE® GSID-26-1 photoacid generator and 5 ml of methyl isobutyl ketone and rolled to give a solution. The second slide was irradiated for 1 minute with a BLAK-RAY® Long Wave Ultraviolet lamp, Model B100 AP and then heated to 140° C. for 5 minutes under nitrogen to give photocrosslinked fluoropolymer #4a. After cooling to room temperature, the film no longer dissolved in methyl isobutyl ketone, indicating that the film had crosslinked.

Preparation of Fluoropolymer #5

A 400 ml autoclave was chilled to less than −20° C. and was loaded with 2 g allyl glycidyl ether, 36 g ethyl vinyl ether, 1 g potassium carbonate and 0.24 g V-601 initiator. The autoclave was evacuate and further charged with 83 g perfluoromethyl vinyl ether. The reaction mixture was shaken and heated to 66° C. The pressure in the autoclave peaked at 157 psi, dropping to 79 psi about 14 hours later. The reaction mixture was dissolved in several hundred ml of acetone and the resulting solution was added with vigorous stirring to 1200 ml methanol and 300 ml water in a Waring blender. The precipitated gum was transferred to a TEFLON® lined tray, purged with nitrogen for several days and finally heated for 3.5 hours in a 75° C. vacuum oven to yield 78 g of a stretchy solid. SEC in THF showed a number average molecular weight of 53,000 and a weight average molecular weight of 119,000. DSC showed a Tg of −6° C.

Preparation of Photocrosslinked Fluoropolymer #5 and #5a

A 0.1 g sample of fluoropolymer #5 was mixed with 0.004 g of a photoacid generator, (p-isopropylphenyl)(p-methylphenyl)iodonium tetrakis(pentafluorophenyl) borate, 0.002 g of a photosensitizer, 2-isopropylthioxanthone, and 5 ml of methyl isobutyl ketone. The mixture was rolled until a solution formed and the solution was dotted onto two glass slides and dried. The first slide was heated for 5 minutes at 140° C., cooled to room temperature after which time, the film easily dissolved in methyl isobutyl ketone, indicating that no crosslinking had occurred. The second slide was irradiated for 1 minute with a BLAK-RAY® Long Wave Ultraviolet lamp, Model B100 AP and then heated to 140° C. for 5 minutes under nitrogen to give photocrosslinked fluoropolymer #5. After cooling to room temperature, the film no longer dissolved in methyl isobutyl ketone, indicating that the film had crosslinked.

A 0.1 g sample of fluoropolymer #5 was mixed with 0.002 g of IRGACURE® GSID-26-1 photoacid generator and 5 ml of methyl isobutyl ketone and rolled to give a solution. The second slide was irradiated for 1 minute with a BLAK-RAY® Long Wave Ultraviolet lamp, Model B100 AP and then heated to 140° C. for 5 minutes under nitrogen to give photocrosslinked fluoropolymer #5a. After cooling to room temperature, the film no longer dissolved in methyl isobutyl ketone, indicating that the film had crosslinked.

Preparation of Fluoropolymer #6

A 400 ml autoclave was chilled to less than −20° C. and was loaded with 12 g allyl glycidyl ether, 36 g ethyl vinyl ether, 1 g potassium carbonate, and 0.24 g V-601 initiator. The autoclave was evacuated and further charged with 83 g perfluoromethyl vinyl ether. The reaction mixture was shaken and heated to 66° C. The pressure in the autoclave peaked at 142 psi, dropping to 115 psi about 12 hours later. The reaction mixture was dissolved in several hundred ml of acetone to remove it from the autoclave, then evaporated down to about 113 g of a viscous fluid. The resulting viscous fluid was added with vigorous stirring to 1200 ml methanol and 300 ml water in a Waring blender. The precipitated viscous layer was transferred to a TEFLON® lined tray, purged with nitrogen overnight and finally heated for 3 hours in a 75° C. vacuum oven. SEC in THF showed a number average molecular weight of 22,000 and a weight average molecular weight of 37,000. DSC showed a Tg of −16° C.

Preparation of Photocrosslinked Fluoropolymer #6

A 0.1 g sample of Polymer #6 was mixed with 0.0082 g of SILFORCE® UV9387C photoinitiator and 0.02 g of 2-isopropylthioxanthone in 5 ml of methyl isobutyl ketone. The mixture was rolled until a solution formed and the solution was dotted onto two glass slides. The first slide was heated for 5 minutes at 140° C., cooled to room temperature after which time, the film easily dissolved in methyl isobutyl ketone after the slide was immersed for 2 minutes, indicating that no crosslinking had occurred. The second slide was irradiated for 1 minute with a BLAK-RAY® Long Wave Ultraviolet lamp, Model B100 AP and then heated to 140° C. for 5 minutes under nitrogen to give photocrosslinked fluoropolymer #5. After cooling to room temperature, the film no longer dissolved in methyl isobutyl ketone after submersion for 2 minutes, indicating that the film had crosslinked.

Preparation of Fluoropolymer #7

A 400 ml autoclave was chilled to less than −20° C. and was loaded with 1 g of powdered potassium carbonate, 0.24 g V-601 initiator and 4 g of allyl glycidyl ether dissolved in 36 g of ethyl vinyl ether. The autoclave was evacuated and was charged with 50 g of tetrafluoroethylene. The autoclave was shaken and heated to 66° C. The pressure in the autoclave peaked at 345 psi, dropping to 160 psi about 16 hours later. The reaction mixture was dissolved in acetone and added in four portions to a Waring blender, each time loaded with 1200 ml methanol and 300 ml of water. The precipitate was purged with nitrogen, dried overnight in a 65° C. vacuum oven and finished for 6 hours in an 80° C. vacuum oven to yield 61 g of a gum elastomer. SEC in THF showed a number average molecular weight of 137,000 and a weight average molecular weight of 283,000.

Preparation of Photocrosslinked Fluoropolymer #7

A 6 g sample of fluoropolymer #7 was added to 16 g of methyl isobutyl ketone and rolled to give a solution. The solution was filtered through a 0.45 micrometer polytetrafluoroethylene syringe filter. 0.075 g of (p-isopropylphenyl)(p-methylphenyl)iodonium tetrakis(pentafluorophenyl)borate and 0.3 g of 2-isopropylthioxanthone was added to the filtered solution to give a clear solution that was transferred to a TEFLON® sheet where it was first purged to partial dryness with nitrogen and then heated for 28 hours in a 50° C. vacuum oven purged with nitrogen. The dried mass was cut up, the pieces were put into the center of a circular mold 60 millimeters in diameter by 1 millimeter thick and then pressed for 1 minute with 4,536 kilograms (10,000 pounds) of force and for 3 minutes with 13,607 kilograms (30,000 pounds) of force. The polymer was taken out of the mold, folded up onto itself, put back into the mold and pressed for 3 minutes at 100° C. with 0 kilograms of force, followed by 3 minutes at 100° C. with 9071 kilograms (20,000 pounds) of force. The fluoropolymer was recovered from the mold, the flashing was cut off and there remained a circular fluoropolymer coupon 60 millimeters in diameter and 1 millimeter thick. The coupon was loaded into a Model LC6B Benchtop Conveyor with a F300 lamp, passed two times under the lamp, flipped over, and passed another two times under the lamp for a total exposure of about 4 joules/cm$^2$. The exposures were completed in air. The polymer was then heated for 5 minutes in a nitrogen purged vacuum oven at 140° C., then allowed to sit in the open air for 1 day.

Water Absorptivity of Photocrosslinked Fluoropolymer #7

The coupon of photocrosslinked fluoropolymer #7 was heated for 24 hours in a vacuum oven at 50° C., transferred hot to a bottle containing DRIERITE® desiccant and, once cooled, was immediately weighed to yield 4.3947 g. The coupon was immersed in deionized water for 24 hours at ambient temperature (20 to 22° C.). The coupon was removed from the water, rapidly wiped dry with a tissue and reweighed to yield 4.3989 g showing a weight gain of 0.096 percent. A 0.0572 g sliver of the coupon was cut off and the sliver was rolled for 44 hours in methyl isobutyl ketone resulting in an increase in weight to 0.2130, or a 272 percent weight gain. Failure to dissolve the sliver confirms that the sample was crosslinked.

Photoimaging of Fluoropolymer #7

4 g of fluoropolymer #7 was added to 22.7 g of propylene glycol monomethyl ether acetate and rolled to make a solution. The bottle was wrapped in aluminum foil to keep out light and 0.05 g of (p-isopropylphenyl)(p-methylphenyl)iodonium borate and 0.1 g of 2-isopropylthioxanthone was added. After rolling to produce a solution, the solution was filtered through a 0.45 micrometer glass microfiber filter (AUTOVIAL™ AV125UGNF), wrapping the receiving vial in aluminum foil. The solution was spin coated onto a silicon wafer at 4500 revolutions per minute (rpm). The film was prebaked for 30 seconds at 65° C. on a hot plate. A chrome photomask was lightly pressed onto the top of the film and the assembly was placed in a nitrogen purge box and exposed for 3 seconds to UV light using a 350 watt high-pressure short-arc lamp with an output of 12 milliwatts/cm$^2$ (OAI Model 200 mask aligner and UV exposure tool that emits UVA radiation around 360-400 nanometers). The film was then post baked for 40 seconds at 170° C. Immersion of the film/silicon wafer support for 65 seconds in propylene glycol monomethyl ether acetate/methanol afforded a pattern having 10 micrometer lines and spaces and a thickness of about 100 nanometers.

Dielectric Constant and Tan δ of Fluoropolymer #7

A 3 g sample of fluoropolymer #7 was pressed between KAPTON® sheets for 3 minutes at 100° C. with 0 pounds of force followed by 3 minutes at 100° C. with about 4536 kilograms (10,000 pounds) of force to give a circular film have a diameter of about 11.4 centimeters and a thickness of about 254 micrometers. The resulting film was cut to span the cavity of a right split-cylinder resonator with a nominal diameter of about 7 centimeters (2.75 inches) and a nominal height of about 11.9 centimeters (4.7 inches). The fluoropolymer film was inserted along the center line between the top and bottom halves of the resonator where the electric field of the TE011 mode is at its maximum. Measuring parallel to the surface of the film at 5365.81 MHz, the dielectric constant was found to be 2.56±0.17 and the tan δ was 0.031±0.001.

Dielectric Constant and Tan δ of Photocrosslinked Fluoropolymer #7

A 4 g sample of fluoropolymer #7 was rolled with 16 g of methyl isobutyl ketone. Once the fluoropolymer dissolved, 0.05 g of (p-isopropylphenyl)(p-methylphenyl)iodonium tetrakis(pentafluorophenyl) borate and 0.2 g of 2-isopropylthioxanthone was added. The mixture was then protected from exposure to light. The resulting solution was transferred to a TEFLON® lined tray and purged with nitrogen. The dry polymer was pressed for 3 minutes at 100° C. with 0 kilograms, followed by pressing for 3 minutes at 100° C. with 2268 kilograms of force (5000 pounds) to make a circular film of about 12.7 centimeters and 203 micrometers thick. The film was exposed to about 1 joule/cm2 of UV light using a UV Fusion Systems, Inc. Model LC6B benchtop conveyor provided with a F300 UV lamp. The film was heated for 5 minutes in a 140° C. nitrogen purged oven. A small section (0.0338 g) of the film was cut off and rolled with 1 g methyl isobutyl ketone for 15 days. After that time, the film was recovered and weighed (0.1320 g, 290 percent weight gain) confirming that the sample was crosslinked. The remaining film was cut to the cavity of a right, split-cylinder resonator with a nominal diameter of about 7 centimeters (2.75 inches) and a nominal height of about 11.9 centimeters (4.7 inches). The film was inserted along the center line between the top and bottom halves of the resonator where the electric field of the TE011 mode was at its maximum. Measuring parallel to the surface of the film at 5384.84 MHz the dielectric constant was found to be 2.89±0.24 and tan δ 0.022±0.001.

Preparation of Fluoropolymer #8

A 400 ml autoclave was chilled to −20° C. and was loaded with 12 g of allyl glycidyl ether, 36 g of ethyl vinyl ether, 1 g of powdered potassium carbonate and 0.24 g of V-601 initiator. The autoclave was evacuated and was further loaded with 58 g of chlorotrifluoroethylene. The reaction mixture was shaken and heated to 66° C. Pressure in the autoclave peaked at 128 psi, dropping to 83 psi about 16 hours later. This gave a gelatinous reaction mixture that was dissolved in acetone and the stripped on a rotary evaporator to give a thick oil. Adding the viscous fluid to a chilled mixture of 1200 ml of water and 300 ml of methanol with vigorous stirring gave solids that were transferred to a TEFLON® sheet in a tray. Blowing down with nitrogen and then into an 80° C. vacuum oven for 3 hours gave 43 grams of fluoropolymer #8.

Dielectric Constant and Tan δ of Fluoropolymer #8

A 3 g sample of fluoropolymer #8 was pressed between two KAPTON® polyimide sheets in a hot press. The hot pressing conditions were as follows; 3 minutes at 100° C. at 0 kilograms of force, 3 minutes at 100° C. at 1,361 kilograms (3,000 pounds) of force after which, the fluoropolymer is recovered by removing it from the KAPTON® polyimide sheets to give a film having a diameter of about 11.4 centimeters and a thickness of about 218 micrometers. The resulting film was cut to span the cavity of a right split-cylinder resonator with a nominal diameter of about 7 centimeters (2.75 inches) and a nominal height of about 11.9 centimeters (4.7 inches). The fluoropolymer film was inserted along the center line between the top and bottom halves of the resonator where the electric field of the TE011 mode is at its maximum. Measuring parallel to the surface of the film at 5370.26 MHz, the dielectric constant was found to be 2.44±0.19 and the tan δ was 0.032±0.002.

Preparation of Fluoropolymer #9

A 1 liter stirred autoclave was loaded with 0.7 g of V-601 initiator, 3 g of potassium carbonate, 300 ml of methyl acetate and 7 g of allyl glycidyl ether dissolved in 108 g of ethyl vinyl ether. The autoclave was sealed, evacuated and pressured with 50 psi of tetrafluoroethylene and vented 3 times after which the autoclave was pressured to 150 psi with tetrafluoroethylene and heated to 66° C. with stirring. Once at 66° C., additional tetrafluoroethylene was added to the autoclave until the pressure increased to 250 psi and maintained at about 250 psi for the next 188 minutes over which time 76 g of tetrafluoroethylene was added. The contents of the autoclave were cooled and recovered as a viscous fluid. This fluid was diluted with about 1500 milliliters of acetone and passed through a 5 micrometer polypropylene prefilter on top of a 1 micrometer polytetrafluoroethylene filter. The filtrate was stripped to a viscous syrup on a rotary evaporator. The syrup was transferred hot to a TEFLON®-lined pan where it was evaporated to tacky solid and then finished for about 3 days in a 75° C. vacuum oven with a nitrogen purge. This gave 162 g of fluoropolymer #9 as a clear, faintly yellow, slightly bubbled sheet.

Photoimaging of Fluoropolymer #9

Figure 2:
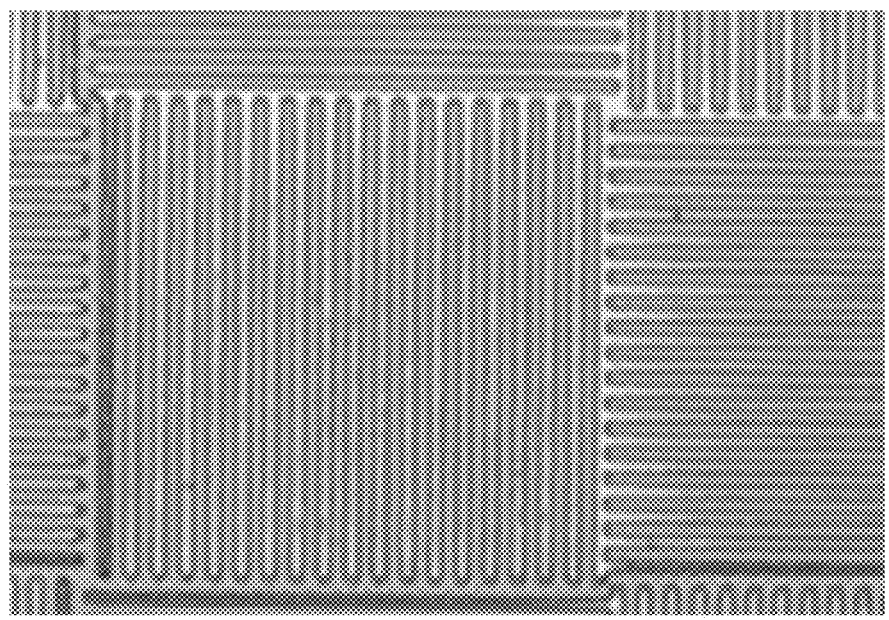
FIG. 2 shows a photomicrograph of an article produced according the disclosed process.

A solution was made by dissolving 4 g of the fluoropolymer #9, 0.05 g of (p-isopropylphenyl)(p-methylphenyl) iodonium tetrakis(pentafluorophenyl) borate, and 0.05 g of 2-isopropylthioxanthone in 22.7 g of propylene glycol monomethyl ether acetate. The solution was spin coated on a 1H,1H,2H,2H-perfluorodecyltriethoxy silane treated silicon wafer at 3000 rpm resulting in a coating 1.9 micrometers thick. The film was prebaked for three minutes on a 100° C. hot plate and subsequently imaged using a Karl Suss Model MA6 mask aligner utilizing a 350 watt Mercury lamp. A total exposure dose of 37.5 millijoules/cm$^2$ was reduced to 21 millijoules/cm$^2$ using a calibrated transmittance mask. The exposed film still on the silicon wafer was then post baked for 3 minutes at 135° C. to allow the photogenerated acid to crosslink fluoropolymer #9. Immersion of the film for 90 seconds in propylene glycol monomethyl ether acetate followed by a 1:2 propylene glycol monomethyl ether acetate/isopropanol rinse afforded a pattern with about 4.5 micrometer features on a film 1.9 micrometers thick. FIG. 2 shows a photomicrograph of the imaged article of this example.

Comparison of Dielectric Constant with Varying Levels of Photoacid Generator/Photosensitizer A solution was made by dissolving 4 g of the fluoropolymer #9, 0.05 g of (p-isopropylphenyl)(p-methylphenyl) iodonium tetrakis(pentafluorophenyl) borate, and 0.05 g of 2-isopropylthioxanthone in 22.7 g of propylene glycol monomethyl ether acetate. The solution was passed through a 0.45 micrometer glass filter and then spin coated on an indium-tin-oxide (ITO) coated glass blank at 1000 rpm. The film was then prebaked for 5 minutes at 100° C., exposed to 200 mJ/cm$^2$ of UV light and post baked 3 minutes at 135° C. to give a photocrosslinked film 3.6 micrometers thick.

The dielectric constant was measured using a Gamry Reference 600 potentiostat/galvanostat/ZRA in potentiostat mode. The cell used for the measurement was effectively a PYREX® tube having a 2.54 centimeter (1 inch) inner diameter. The electrolyte was a 0.5M sodium chloride solution. The reference electrode and counter electrodes were Ag/AgCl and platinum, respectively. Measurements were performed over a frequency range from sub-hertz to 100 KHz at zero volts versus open circuit potential with a 10 mV AC signal. Ten measurements were made per frequency decade. A Randles cell model was used to fit the data and determine the film capacitance at 100 kHz. The ground plane was an ITO coated glass substrate. Both the ITO resistance and solution resistance were accounted for in the calculation by performing measurements in the absence of the polymer film. The dielectric was found to 2.5±0.2 at 100 kHz.

A solution was made by dissolving 4 g of the fluoropolymer #9, 0.025 g of (p-isopropylphenyl)(p-methylphenyl) iodonium tetrakis(pentafluorophenyl) borate, and 0.025 g of 2-isopropylthioxanthone in 22.7 g of propylene glycol monomethyl ether acetate. The solution was passed through a 0.45 micrometer glass fiber filter and then spin coated on an indium-tin-oxide coated glass blank at 1000 rpm. The film was then prebaked 5 minutes at 100° C., blanket exposed to 200 mJ/cm$^2$, and post baked for 3 minutes at 135° C. to give a photocrosslinked film 4 micrometers thick.

The dielectric constant was measured using a Gamry Reference 600 potentiostat/galvanostat/ZRA in potentiostat mode. The cell used for the measurement was effectively a PYREX® tube having a 2.54 centimeter (1 inch) inner diameter. The electrolyte was a 0.5M sodium chloride solution. The reference electrode and counter electrodes were Ag/AgCl and platinum, respectively. Measurements were performed over a frequency range from sub-hertz to 100 kHz at zero volts versus open circuit potential with a 10 mV AC signal. Ten measurements were made per frequency decade. A Randles cell model was used to fit the data and determine the film capacitance at 100 kHz. The ground plane was an ITO coated glass substrate. Both the ITO resistance and solution resistance were accounted for in the calculation by performing measurements in the absence of the polymer film. Dielectric was found to 2.3±0.2 at 100 kHz.

What is claimed is:

1. A passivation layer comprising a layer of a photocrosslinked coating composition disposed on at least a portion of a substrate, wherein the coating composition consists essentially of:
    i) a photocrosslinkable fluoropolymer having repeat units comprising:
        (a) a fluoroolefin;
        (b) an alkyl vinyl ether wherein the alkyl group is a C1 to C6 straight or a C3 to C6 branched or cyclic saturated hydrocarbon radical; and
        (c) a vinyl epoxide;
    ii) a photoacid generator;
    iii) an optional photosensitizer; and
    iv) a carrier medium;
    wherein the photocrosslinkable fluoropolymer has a number average molecular weight in the range of from 20,000 to 300,000, and, wherein the layer of photocrosslinked coating composition has a dielectric constant in the range of from 1 to 5 when measured at 100 kHz, and wherein the layer of the photocrosslinked coating composition having a thickness in the range of from 0.01 micrometers to 300 micrometers has photocrosslinked features having a minimum width that is the larger of a) about 10 percent the thickness of the coating composition or b) 0.5 micrometers.

2. The passivation layer of claim 1, wherein the fluoroolefin is tetrafluoroethylene, chlorotrifluoroethylene, hexafluoropropylene, trifluoroethylene, perfluoromethyl vinyl ether, vinyl fluoride, vinylidene fluoride, perfluorodimethyldioxole, trifluoropropylene, perfluoro(2-methylene-4-methyl-1,3-dioxolane, hexafluoroisobutylene, methyl 3-[1-[difluoro[(trifluorovinyl)oxy]methyl]-1,2,2,2-tetrafluoroethoxy]-2,2,3,3-tetrafluoropropionate, 2-[1-[difluoro [(1,2,2-trifluoroethenyl)oxy]methyl]-1,2,2,2-tetrafluoroethoxy]-1,1,2,2-tetrafluoro-ethanesulfonyl fluoride or a combination thereof; or wherein the alkyl vinyl ether is methyl vinyl ether, ethyl vinyl ether, n-propyl vinyl ether, isopropyl vinyl ether, n-butyl vinyl ether, sec-butyl vinyl ether, t-butyl vinyl ether, n-pentyl vinyl ether, isoamyl vinyl ether, hexyl vinyl ether, cyclohexyl vinyl ether or a combination thereof; or wherein the vinyl epoxide is allyl glycidyl ether, glycidyl methacrylate, or a combination thereof.

3. The passivation layer of claim 1, wherein the photocrosslinked features have a width in the range of from 0.5 to 5.0 micrometers.

4. The passivation layer of claim 1, wherein the carrier medium is methyl isobutyl ketone, 2-heptanone, propylene glycol methyl ether acetate or a combination thereof.

5. The passivation layer of claim 1, wherein the layer of the photocrosslinked coating composition has a dielectric constant in the range of from 1.1 to 4.5 when measured at 100 kHz.

6. The passivation layer of claim 1, wherein the layer of the photocrosslinked coating composition absorbs in the range of 0.01 to 1.0 percent by weight percent by weight of water when submerged in deionized water at a temperature in the range of from 20 to 22° C. for 24 hours.

7. The passivation layer of claim 1, wherein the layer of the photocrosslinked coating has a thickness in the range of about 0.1 micrometers to about 50 micrometers.

8. The passivation layer of claim 1, wherein the passivation layer is a layer of a thin film transistor, organic field effect transistor, semiconductor, semiconductor oxide field effect transistor, integrated circuit, light emitting diode, display device, flexible circuit, solder mask, photovoltaic device, printed circuit board, an interlayer dielectric, optical waveguide, a micro electromechanical system, a layer of an electronic display device or a layer of a microfluidic device or chip.

9. The passivation layer of claim 1, wherein the layer is in the form of a patterned surface for electrowetting.

10. The passivation layer of claim 1, wherein the photocrosslinked coating composition comprises in the range of about 80 to about 99.5 percent by weight of the photocrosslinkable fluoropolymer; from 0 to about 10 percent by weight of the photosensitizer; and from about 0.1 to about 10 percent by weight of the photoacid generator, wherein the percentages by weight are based on the total weight of the photocrosslinked coating composition.

11. The passivation layer of claim 1, wherein the photosensitizer is 2-isopropyl-9H-thioxanthen-9-one, 4-isopropyl-9H-thioxanthen-9-one, 1-chloro-4-propoxythioxanthone, 2-isopropylthioxanthone, phenothiazine or a combination thereof.

12. The passivation layer of claim 1, wherein the photoacid generator is (p-isopropylphenyl)(p-methylphenyl)iodonium tetrakis(pentafluorophenyl)borate, tris[4-(4-acetylphenyl)sulfanylphenyl]sulfonium tris (trifluoromethanesulfonyl)methide, bis(1,1-dimethylethylphenyl)iodonium salt with tris [(trifluoromethane)sulfonyl]methane or bis(4-decylphenyl) iodonium hexafluoroantimonate oxirane, 4,4',4''-tris(t-butylphenyl)sulfonium triflate, 4,4'-di-t-butylphenyl iodonium triflate, diphenyliodonium tetrakis(pentafluorophenyl)sulfonium borate, triarylsulfonium-tetrakis(pentafluorophenyl) borate, triphenylsulfonium tetrakis(pentafluorophenyl) sulfonium borate, 4,4'-di-t-butylphenyl iodonium tetrakis(pentafluorophenyl) borate, tris(t-butylphenyl) sulfonium tetrakis(pentafluorophenyl) borate, 4-methylphenyl-4-(1-methylethyl)phenyl iodonium tetrakis(pentafluorophenyl) borate or a combination thereof.

13. A process comprising:
    (1) providing a photocrosslinkable coating composition consisting essentially of:
        i) a photocrosslinkable fluoropolymer comprising:

(a) a fluoroolefin;
(b) an alkyl vinyl ether wherein the alkyl group is a C1 to C6 straight or a C3 to C6 branched or cyclic saturated hydrocarbon radical;
(c) a vinyl epoxide; and
(d) optionally, other monomers; and
ii) a photoacid generator;
iii) an optional photosensitizer; and
iv) a carrier medium;
(2) applying a layer of the photocrosslinkable coating composition onto at least a portion of a substrate;
(3) removing at least a portion of the carrier medium;
(4) irradiating at least a portion of the layer of the photocrosslinkable coating composition with ultraviolet light;
(5) heating the applied layer of photocrosslinkable coating composition; and
(6) removing at least a portion of the uncrosslinked photocrosslinkable fluoropolymer;
wherein the photocrosslinkable fluoropolymer has a number average molecular weight in the range of from 20,000 to 300,000, and, wherein the layer of photocrosslinked coating composition has a dielectric constant in the range of from 1 to 5 when measured at 100 kHz, and wherein a layer of the photocrosslinked coating composition having a thickness in the range of from 0.01 micrometers to 300 micrometers has photocrosslinked features having a minimum width that is the larger of a) about 10 percent the thickness of the coating composition or b) 0.5 micrometers.

14. The process of claim 13 wherein the process further comprises the step of applying an adhesion promoter to at least a portion of the substrate prior to the step (2), applying a layer of the photocrosslinkable coating composition onto at least a portion of the substrate.

15. The process of claim 13, wherein the photocrosslinkable coating composition comprises in the range of about 80 to about 99.5 percent by weight of the photocrosslinkable fluoropolymer; from 0 to about 10 percent by weight of the photosensitizer; and from about 0.5 to about 10 percent by weight of the photoacid generator, wherein the percentages by weight are based on the total weight of the photocrosslinked coating composition.

16. The process of claim 13, wherein the fluoroolefin is tetrafluoroethylene, chlorotrifluoroethylene, hexafluoropropylene, trifluoroethylene, perfluoromethyl vinyl ether, vinyl fluoride, vinylidene fluoride, perfluorodimethyldioxole, trifluoropropylene, perfluoro(2-methylene-4-methyl-1,3-dioxolane, hexafluoroisobutylene, methyl 3-[1-[difluoro[(trifluorovinyl)oxy]methyl]-1,2,2,2-tetrafluoroethoxy]-2,2,3,3-tetrafluoropropionate, 2-[1-[difluoro[(1,2,2-trifluoroethenyl)oxy]methyl]-1,2,2,2-tetrafluoroethoxy]-1,1,2,2-tetrafluoro-ethanesulfonyl fluoride or a combination thereof; or wherein the alkyl vinyl ether is methyl vinyl ether, ethyl vinyl ether, n-propyl vinyl ether, isopropyl vinyl ether, n-butyl vinyl ether, sec-butyl vinyl ether, t-butyl vinyl ether, n-pentyl vinyl ether, isoamyl vinyl ether, hexyl vinyl ether, cyclohexyl vinyl ether or a combination thereof; or wherein the vinyl epoxide is allyl glycidyl ether, glycidyl methacrylate, glycidyl acrylate or a combination thereof.

17. The process of claim 13, wherein a layer of the photocrosslinked coating composition has a dielectric constant in the range of from 1.1 to 4.5, when measured at 100 kHz.

18. The process of claim 13, wherein a layer of the crosslinked photocrosslinkable fluoropolymer absorbs in the range of 0.05 to 1.0 percent by weight percent by weight of water when submerged in deionized water at a temperature in the range of from 20 to 22° C. for 24 hours.

19. The process of claim 13, wherein the photosensitizer is 2-isopropyl-9H-thioxanthen-9-one, 4-isopropyl-9H-thioxanthen-9-one, 1-chloro-4-propoxythioxanthone, 2-isopropylthioxanthone, phenothiazine or a combination thereof.

20. The process of claim 13, wherein the photoacid generator is (p-isopropylphenyl)(p-methylphenyl)iodonium tetrakis(pentafluorophenyl)borate, tris[4-(4-acetylphenyl)sulfanylphenyl]sulfonium tris(trifluoromethanesulfonyl)methide, bis(1,1-dimethylethylphenyl)iodonium salt with tris[(trifluoromethane)sulfonyl]methane or bis(4-decylphenyl)iodonium hexafluoroantimonate oxirane, 4,4',4"-tris(t-butylphenyl)sulfonium triflate, 4,4'-di-t-butylphenyl iodonium triflate, diphenyliodonium tetrakis(pentafluorophenyl) sulfonium borate, triarylsulfonium-tetrakis (pentafluorophenyl) borate, triphenylsulfonium tetrakis (pentafluorophenyl) sulfonium borate, 4,4'-di-t-butylphenyl iodonium tetrakis(pentafluorophenyl) borate, tris(t-butylphenyl) sulfonium tetrakis(pentafluorophenyl) borate, 4-methylphenyl-4-(1-methylethyl)phenyl iodonium tetrakis (pentafluorophenyl) borate or a combination thereof.

21. The process of claim 13, wherein at least a portion of the carrier medium is removed by exposing the applied layer of photocrosslinkable coating composition to elevated temperatures, exposure to less than atmospheric pressure, by directly or indirectly blowing gas onto the substrate or a combination thereof.

22. The process of claim 13 wherein the step of (4) irradiating is performed in air or a nitrogen atmosphere.

23. The process of claim 13, wherein the wavelength of ultraviolet light is in the range of from 325 to 425 nm.

24. The process of claim 13, wherein the ultraviolet light exposure is in the range of from 10 to 500 millijoules/cm$^2$.

25. The process of claim 13, wherein the heating step (5) occurs at a temperature in the range of from about 80° C. to about 200° C. for about 1 to about 7 minutes.

26. The process of claim 13, wherein the removing step (6) occurs by dissolving the photocrosslinkable fluoropolymer using a carrier medium that dissolves the photocrosslinkable fluoropolymer.

27. The process of claim 13, wherein the carrier medium is methyl isobutyl ketone, 2-heptanone, propylene glycol methyl ether acetate or a combination thereof.

28. The process of claim 13, wherein the carrier medium is a 1:0 to 3:1 mixture of a solvent and a nonsolvent for the crosslinked fluoropolymer.

29. The process of claim 28, wherein the solvent is methyl isobutyl ketone, 2-heptanone, or propylene glycol methyl ether acetate and the nonsolvent is hexane.

30. An article comprising the passivation layer of claim 1.

* * * * *